(12) United States Patent
Endo et al.

(10) Patent No.: US 7,011,934 B2
(45) Date of Patent: Mar. 14, 2006

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 267 days.

(21) Appl. No.: 10/442,304

(22) Filed: May 21, 2003

(65) Prior Publication Data

US 2003/0224296 A1 Dec. 4, 2003

(30) Foreign Application Priority Data

Jun. 3, 2002 (JP) .............................. 2002-161644

(51) Int. Cl.
*G03F 7/00* (2006.01)
(52) U.S. Cl. .................... 430/327; 430/322; 430/330
(58) Field of Classification Search ................ 430/322, 430/327, 330
See application file for complete search history.

(56) References Cited

U.S. PATENT DOCUMENTS 5,501,739 A * 3/1996 Yamada et al. ............. 118/719
5,576,247 A * 11/1996 Yano et al. ................. 438/760

FOREIGN PATENT DOCUMENTS

JP P2002-353308 A 12/2002

* cited by examiner

*Primary Examiner*—Nicole Barreca
(74) *Attorney, Agent, or Firm*—McDermott Will & Emery LLP (57) ABSTRACT

An underlying film having pores or including an organic material is formed on a substrate. In a first chamber, hexamethyldisilazane is supplied onto the surface of the underlying film while annealing the substrate, so as to form a first molecular layer of trimethylsilyl groups on the underlying film. Thereafter, the underlying film is allowed to stand outside the first chamber. Next, in a second chamber, hexamethyldisilazane is supplied onto the surface of the first molecular layer, so as to form a second molecular layer of trimethylsilyl groups on the first molecular layer. Then, a resist film made of a chemically amplified resist material is formed above the underlying film having the second molecular layer thereon. The resist film is subjected to pattern exposure by selectively irradiating with exposing light, and the resist film is developed after the pattern exposure, so as to form a resist pattern.

5 Claims, 9 Drawing Sheets

PATTERN FORMATION METHOD

BACKGROUND OF THE INVENTION

The present invention relates to a pattern formation method for use in fabrication processing or the like for a semiconductor integrated circuit device.

In the fabrication processing for a semiconductor integrated circuit device, the size of a resist pattern (pattern width) formed by lithography technique is required to be further refined in accordance with increase in the degree of integration of semiconductor integrated circuits.

Also, the dielectric constant of an insulating film is desired to be further lowered in accordance with improved performance of semiconductor devices. Therefore, use of a low dielectric insulating film that has a lower dielectric constant than a generally used silicon oxide film, such as an insulating film having pores or including an organic material, has been proposed.

Now, a conventional pattern formation method will be described with reference to FIGS. 8A through 8C, 9A and 9B.

First, a chemically amplified resist material having the following composition is prepared:

| | |
|---|---|
| Base polymer: poly((methoxymethyl acrylate) − (γ-butyrolactone methacrylate)) (wherein methoxymethyl acrylate:γ-butyrolactone methacrylate = 70 mol %:30 mol %) | 2 g |
| Acid generator: triphenylsulfonium triflate | 0.04 g |
| Solvent: propylene glycol monomethyl ether acetate | 20 g |

Figure 8A:
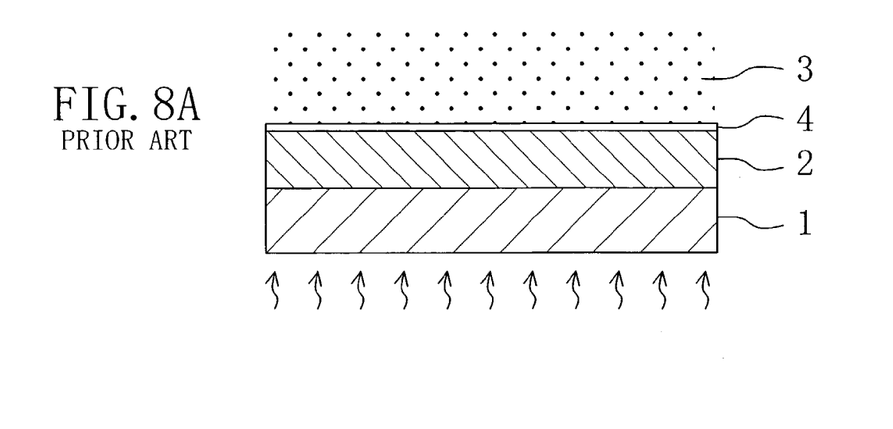
FIGS. 8A, 8B and 8C are cross-sectional views for showing procedures in a conventional pattern formation method.

Next, as shown in FIG. 8A, an organic polymer made of aromatic hydrocarbon including no fluorine (for example, SiLK manufactured by Hitachi Chemical Co., Ltd. (with a dielectric constant of 2.65)) is deposited on a substrate 1 so as to form a low dielectric insulating film 2 corresponding to an underlying film. Thereafter, while annealing the substrate 1 at a temperature of 90° C., gas-phase hexamethyldisilazane 3 is supplied onto the surface of the low dielectric insulating film 2 for 90 seconds, so as to form a molecular layer 4 of trimethylsilyl groups on the low dielectric insulating film 2.

Figure 8B:
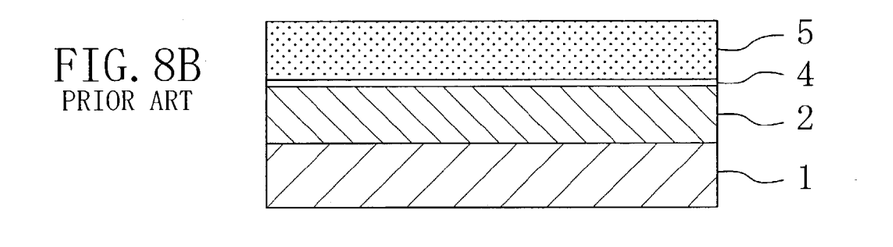

Next, as shown in FIG. 8B, the chemically amplified resist material having the aforementioned composition is applied over the low dielectric insulating film 2 having the molecular layer 4 thereon, so as to form a resist film 5 with a thickness of 0.4 μm.

Figure 8C:
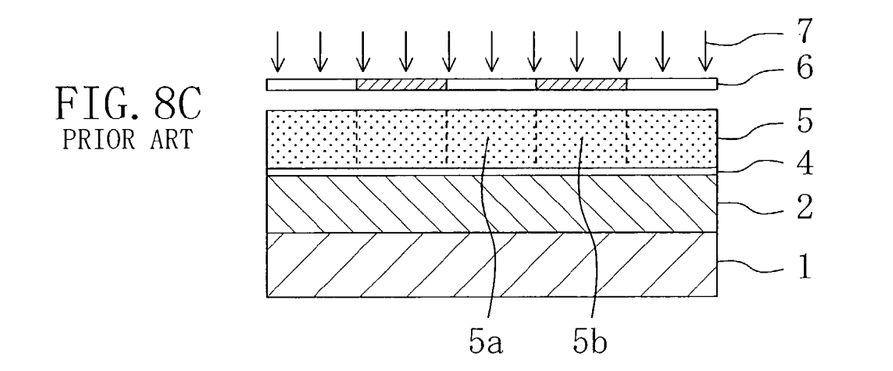

Next, as shown in FIG. 8C, pattern exposure is carried out by irradiating the resist film 5 with ArF excimer laser 7 emitted from an ArF laser exposure machine (with numerical aperture NA of 0.60) through a photomask 6 having a desired pattern.

Figure 9A:
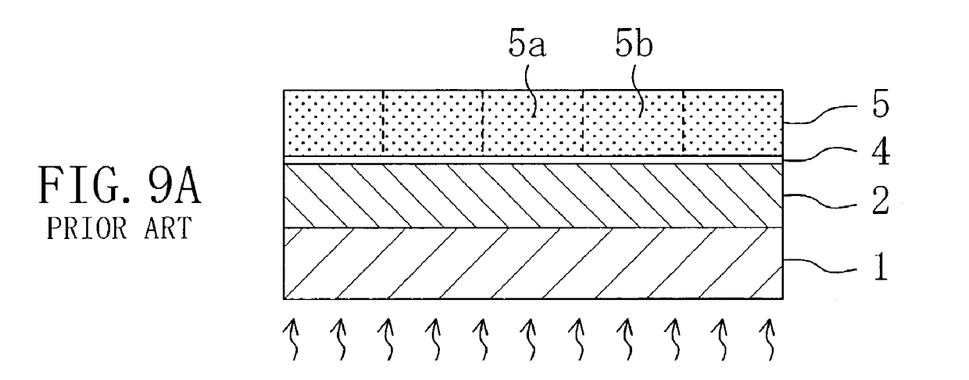
FIGS. 9A and 9B are cross-sectional views for showing other procedures in the conventional pattern formation method.

Then, as shown in FIG. 9A, the resist film 5 is subjected to post-exposure bake (PEB) by annealing the substrate 1 at a temperature of 105° C. for 90 seconds. Thus, an exposed portion 5a of the resist film 5 becomes soluble in an alkaline developer because an acid is generated from the acid generator therein while an unexposed portion 5b of the resist film 5 remains insoluble in an alkaline developer because no acid is generated from the acid generator therein.

Next, after the pattern exposure, the resist film 5 is developed with an alkaline developer of a 2.38 wt % tetramethylammonium hydroxide aqueous solution for 60 seconds and is then rinsed with pure water for 60 seconds. Thereafter, the resultant resist film 5 is dried. Thus, a resist pattern 8 with a pattern width of 0.11 μm is formed from the unexposed portion 5b of the resist film 5 as shown in FIG. 9B.

Figure 9B:
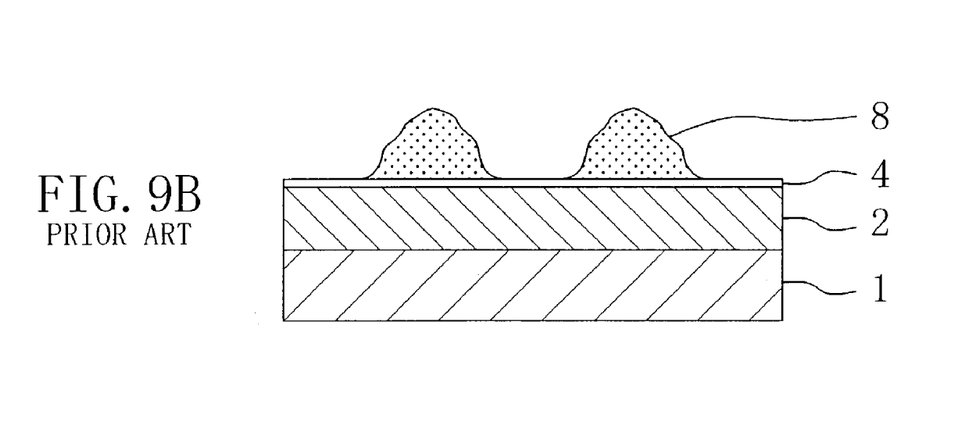

The cross-sectional shape of the resist pattern 8 has, however, a footing shape as shown in FIG. 9B, and thus, the pattern shape is defective.

The conventional pattern formation method shown in FIGS. 8A through 8C, 9A and 9B is employed for forming a positive resist pattern 8. In the case where a negative resist pattern is formed, the resultant resist pattern has an undercut cross-sectional shape, and the pattern shape is also defective.

When a resist pattern in a defective pattern shape is used for etching a film to be etched, the shape of the resultant pattern of the etched film is also defective, which disadvantageously lowers the yield of semiconductor devices.

SUMMARY OF THE INVENTION

In consideration of the aforementioned conventional disadvantage, an object of the invention is forming a resist pattern in a good pattern shape.

In order to achieve the object, the present inventors have made a variety of examinations on the cause of the defective shape of a resist pattern. As a result, it has been found that in the case where an underlying film has pores or includes an organic material, the shape of a resultant resist pattern formed thereon becomes defective.

Also, the reason why a resist pattern formed on an underlying film having pores or including an organic material becomes defective has been studied, resulting in finding the following phenomenon: Moisture or an alkaline impurity included in a low dielectric insulating film, such as a porous film having pores or an organic film having a rough surface due to an organic material included therein, passes through gaps in a molecular layer so as to move to the bottom of the resist film. Therefore, when the resist film is subjected to the pattern exposure, an acid generated from the acid generator is degraded in its acidity by the moisture or is deactivated through neutralization with the alkaline impurity. Accordingly, the amount of acid is insufficient at the bottom of an exposed portion of the resist film, so that a catalytic reaction of the acid cannot be sufficiently carried out. As a result, solubility in a developer is spoiled at the bottom of an exposed portion of a negative resist film and insolubility in a developer is spoiled at the bottom of an exposed portion of a positive resist film, and therefore, a positive resist pattern is in a defective footing shape and a negative resist pattern is in a defective undercut shape.

The present invention was devised on the basis of the aforementioned findings.

Specifically, the first pattern formation method of this invention includes the steps of forming, on a substrate, an underlying film having pores or including an organic material; forming a first molecular layer of trimethylsilyl groups on the underlying film by supplying hexamethyldisilazane onto a surface of the underlying film while annealing the substrate in a first chamber; allowing the underlying film having the first molecular layer thereon to stand outside the first chamber; forming a second molecular layer of trimethylsilyl groups on the first molecular layer by supplying hexamethyldisilazane onto a surface of the first molecular layer in a second chamber; forming a resist film made of a chemically amplified resist material above the underlying film having the second molecular layer thereon; performing pattern exposure by selectively irradiating the resist film with exposing light; and forming a resist pattern by developing the resist film after the pattern exposure. In the first pattern formation method, the first chamber and the second chamber may be the same chamber or different chambers.

In the first pattern formation method, the step of allowing the underlying film to stand outside the first chamber may include a sub-step of annealing the substrate.

In the first pattern formation method, the step of forming a second molecular layer may include a sub-step of annealing the substrate.

The second pattern formation method of this invention includes the steps of forming, on a substrate, an underlying film having pores or including an organic material; forming a first molecular layer of trimethylsilyl groups on the underlying film by supplying hexamethyldisilazane onto a surface of the underlying film while annealing the substrate in a chamber; allowing the underlying film to stand in the chamber with supply of hexamethyldisilazane stopped; forming a second molecular layer of trimethylsilyl groups on the first molecular layer by supplying hexamethyldisilazane onto a surface of the first molecular layer in the chamber; forming a resist film made of a chemically amplified resist material above the underlying film having the second molecular layer thereon; performing pattern exposure by selectively irradiating the resist film with exposing light; and forming a resist pattern by developing the resist film after the pattern exposure.

In the first or second pattern formation method of this invention, a chemically amplified resist film is formed on the underlying film having two molecular layers, that is, the first and second molecular layers, thereon. Therefore, moisture or an alkaline impurity included in the underlying film is blocked by the two molecular layers and hence minimally reaches the bottom of the resist film. Accordingly, when the resist film is subjected to the pattern exposure, phenomenon that an acid generated from an acid generator is degraded in its acidity by the moisture or is deactivated through neutralization with the alkaline impurity minimally occurs, so that a catalytic reaction of the acid can be sufficiently performed at the bottom of an exposed portion of the resist film. As a result, a resist pattern can be formed in a good cross-sectional shape free from a footing shape or an undercut shape.

In the second pattern formation method, the step of allowing the underlying film to stand in the chamber may include a sub-step of annealing the substrate.

In the second pattern formation method, the step of forming a second molecular layer may include a sub-step of annealing the substrate.

DETAILED DESCRIPTION OF THE INVENTION

Embodiment 1

A pattern formation method according to Embodiment 1 of the invention will now be described with reference to FIGS. 1A through 1D and 2A through 2C.

First, a chemically amplified resist material having the following composition is prepared:

| | |
|---|---|
| Base polymer: poly((methoxymethyl acrylate) – (γ-butyrolactone methacrylate)) (wherein methoxymethyl acrylate:γ-butyrolactone methacrylate = 70 mol %:30 mol %) | 2 g |
| Acid generator: triphenylsulfonium triflate | 0.04 g |
| Solvent: propylene glycol monomethyl ether acetate | 20 g |

Figure 1A:
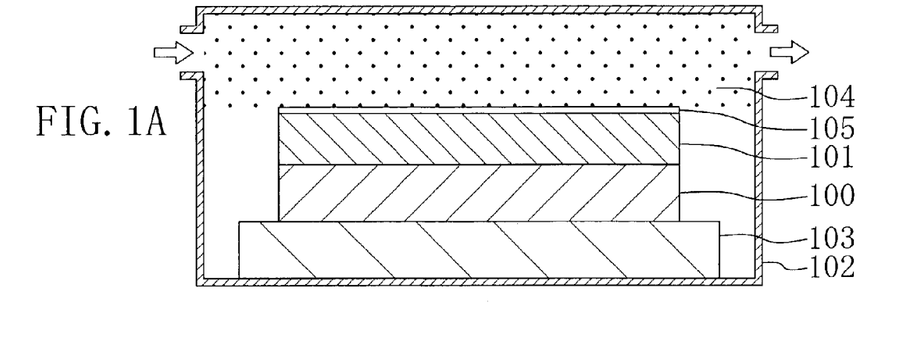
FIGS. 1A, 1B, 1C and 1D are cross-sectional views for showing procedures in a pattern formation method according to Embodiment 1 of the invention.

Next, as shown in FIG. 1A, an organic polymer made of aromatic hydrocarbon including no fluorine (for example, SiLK manufactured by Hitachi Chemical Co., Ltd. (with a dielectric constant of 2.65)) is deposited on a substrate 100, so as to form a low dielectric insulating film 101 corresponding to an underlying film. Thereafter, the substrate 100 is placed in a first chamber 102 and kept on a first hot plate 103. Then, while annealing the substrate 100 with the first hot plate 103 at a temperature of 90° C., gas-phase hexamethyldisilazane 104 is supplied onto the surface of the low dielectric insulating film 101 for 90 seconds, thereby forming a first molecular layer 105 of trimethylsilyl groups on the low dielectric insulating film 101.

Figure 1B:
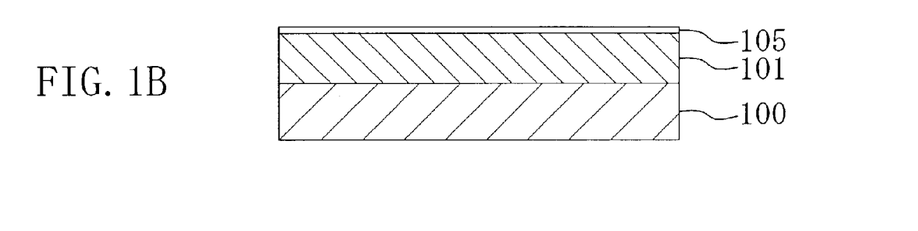
Figure 7:
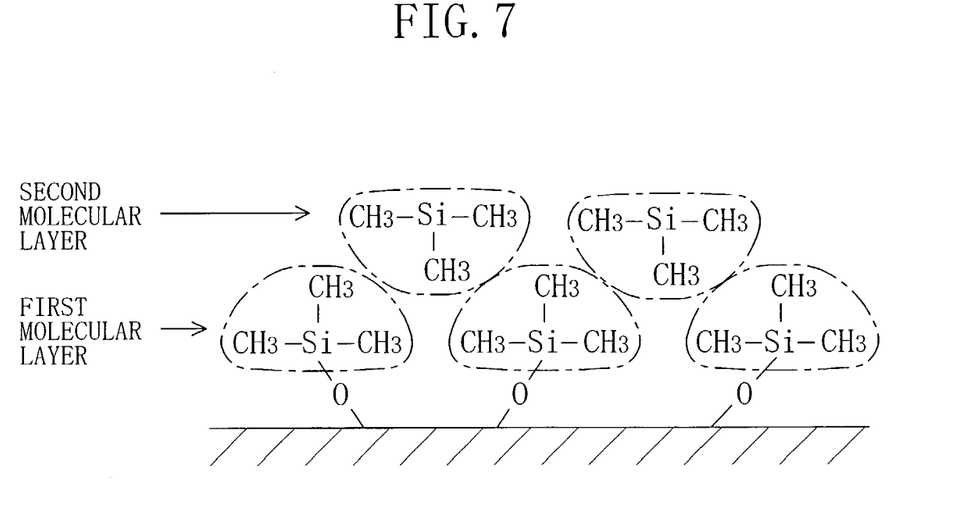
FIG. 7 is a schematic diagram of a second molecular layer formed on a first molecular layer in any of Embodiments 1 through 3.

Next, as shown in FIG. 1B, the substrate 100 is taken out of the first chamber 102, and the low dielectric insulating film 101 is allowed to stand outside the first chamber 102. Thus, the orientation of the first molecular layer 105 is disordered as shown in FIG. 7.

Figure 1C:
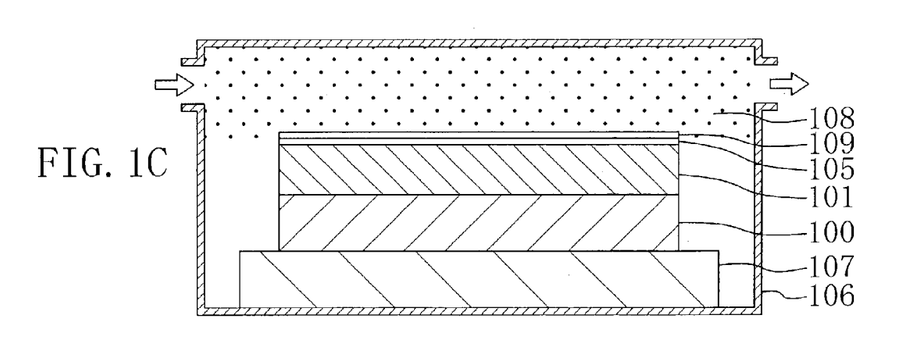

Then, as shown in FIG. 1C, the substrate 100 is placed in a second chamber 106 and kept on a second hot plate 107. Thereafter, while annealing the substrate 100 with the second hot plate 107 at a temperature of 90° C., gas-phase hexamethyldisilazane 108 is supplied onto the surface of the first molecular layer 105 for 90 seconds, thereby forming a second molecular layer 109 of trimethylsilyl groups on the first molecular layer 105. In this manner, the second molecular layer 109 is formed as shown in FIG. 7 in such a manner that the trimethylsilyl groups of the second molecular layer 109 are caught between the trimethylsilyl groups of the first molecular layer 105 whose orientation has been disordered.

Figure 1D:
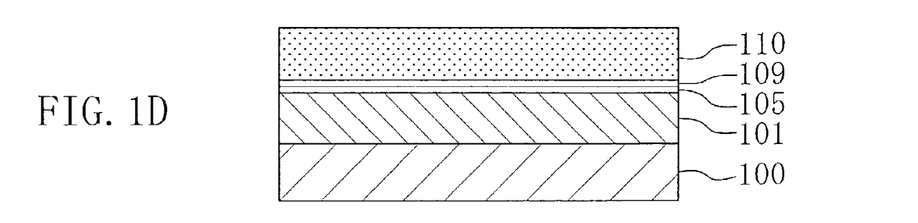

Thereafter, as shown in FIG. 1D, the substrate 100 is taken out of the second chamber 106, and the chemically amplified resist material having the aforementioned composition is applied over the low dielectric insulating film 101 having the second molecular layer 109 thereon, so as to form a resist film 110 with a thickness of 0.4 µm.

Figure 2A:
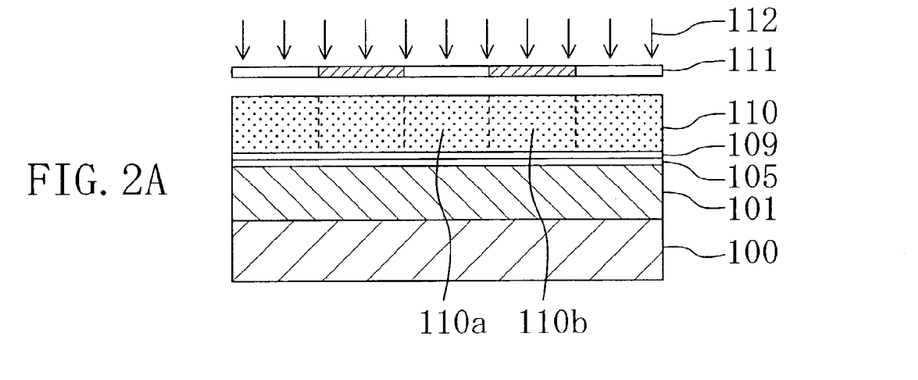
FIGS. 2A, 2B and 2C are cross-sectional views for showing other procedures in the pattern formation method of Embodiment 1.

Then, as shown in FIG. 2A, pattern exposure is carried out by irradiating the resist film 110 with ArF excimer laser 112 emitted from an ArF excimer laser exposure machine (with numerical aperture NA of 0.60) through a photomask 111 having a desired pattern.

Figure 2B:
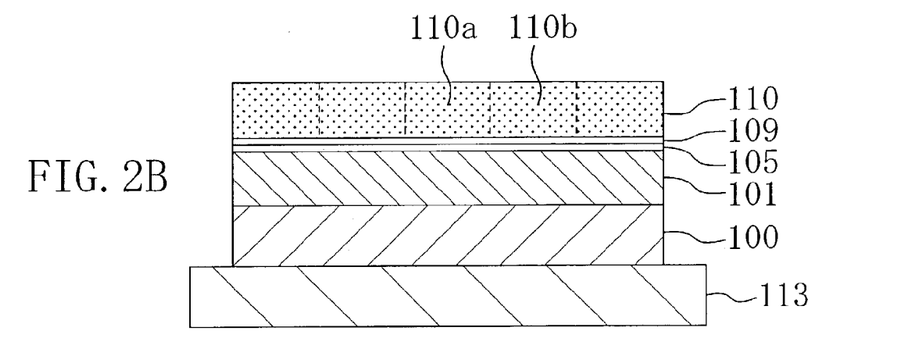

Next, as shown in FIG. 2B, the resist film 110 is subjected to post-exposure bake (PEB) by annealing the substrate 100 with a third hot plate 113 at a temperature of 105° C. for 90 seconds. Thus, an exposed portion 110a of the resist film 110 becomes soluble in an alkaline developer because an acid is generated from the acid generator therein while an unexposed portion 110b of the resist film 110 remains insoluble in an alkaline developer because no acid is generated from the acid generator therein.

Figure 2C:
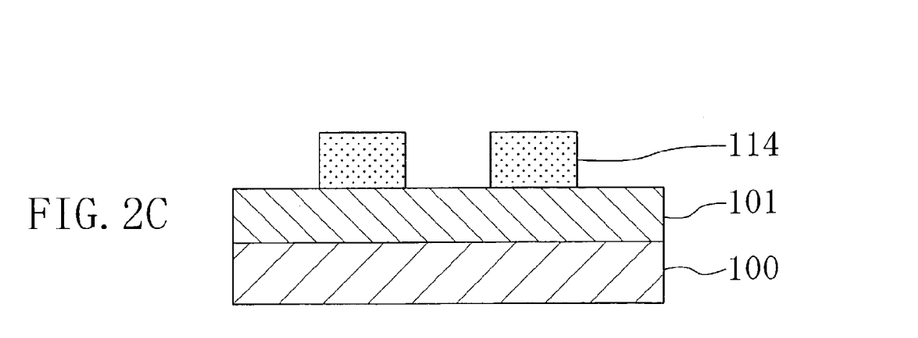

Next, after the pattern exposure, the resist film 110 is developed with an alkaline developer of a 2.38 wt % tetramethylammonium hydroxide aqueous solution for 60 seconds and then is rinsed with pure water for 60 seconds. Then, the resultant resist film 110 is dried. Thus, a resist pattern 114 with a pattern width of 0.11 µm formed from the unexposed portion 110b of the resist film 110 is obtained in a rectangular cross-sectional shape free from a footing shape as shown in FIG. 2C.

In Embodiment 1, the resist film 110 is formed above the low dielectric insulating film 101 having the two molecular layers of the first molecular layer 105 and the second molecular layer 109 thereon, and therefore, moisture or an alkaline impurity included in the low dielectric insulating film 101 is blocked by the two molecular layers and hence minimally reaches the bottom of the resist film 110. Therefore, when the resist film 110 is subjected to the pattern exposure, the phenomenon that the acid generated from the acid generator is degraded in the acidity by the moisture or is deactivated through neutralization with the alkaline impurity minimally occurs. As a result, a catalytic reaction of the acid can be sufficiently carried out at the bottom of the exposed portion 110a of the resist film 110, so that the resist pattern 114 can be formed in a good cross-sectional shape free from a footing shape.

In Embodiment 1, when the low dielectric insulating film 101 is allowed to stand outside the first chamber 102, the substrate 100 may or may not be annealed.

Also, although the hexamethyldisilazane 108 is supplied while annealing the substrate 100 in forming the second molecular layer 109 on the first molecular layer 105 in Embodiment 1, the hexamethyldisilazane 108 may be supplied without annealing the substrate 100.

Furthermore, in Embodiment 1, the first chamber 102 and the second chamber 106 may be the same chamber or different chambers.

Embodiment 2

A pattern formation method according to Embodiment 2 of the invention will now be described with reference to FIGS. 3A through 3D and 4A through 4C.

First, a chemically amplified resist material having the following composition is prepared:

| | |
|---|---|
| Base polymer: poly((methoxymethyl acrylate) – (γ-butyrolactone methacrylate)) (wherein methoxymethyl acrylate:γ-butyrolactone methacrylate = 70 mol %:30 mol %) | 2 g |
| Acid generator: triphenylsulfonium triflate | 0.04 g |
| Solvent: propylene glycol monomethyl ether acetate | 20 g |

Figure 3A:
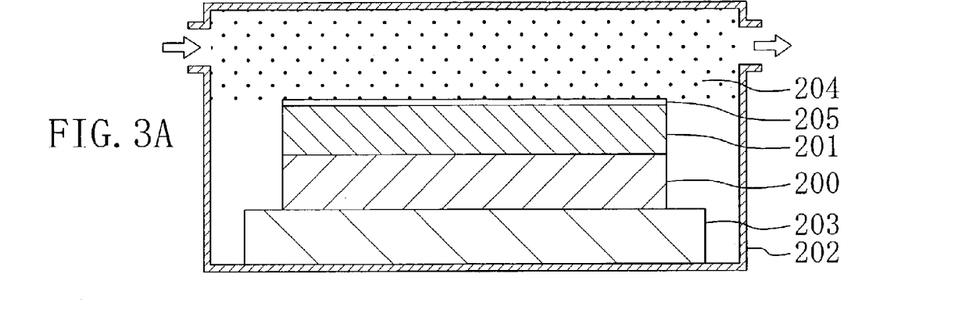
FIGS. 3A, 3B, 3C and 3D are cross-sectional views for showing procedures in a pattern formation method according to Embodiment 2 of the invention.

Next, as shown in FIG. 3A, an organic polymer made of aromatic hydrocarbon including no fluorine (for example, SiLK manufactured by Hitachi Chemical Co., Ltd. (with a dielectric constant of 2.65)) is deposited on a substrate 200, so as to form a low dielectric insulating film 201 corresponding to an underlying film. Thereafter, the substrate 200 is placed in a chamber 202 and kept on a first hot plate 203. Then, while annealing the substrate 200 with the first hot plate 203 at a temperature of 90° C., gas-phase hexamethyldisilazane 204 is supplied onto the surface of the low dielectric insulating film 201 for 90 seconds, thereby forming a first molecular layer 205 of trimethylsilyl groups on the low dielectric insulating film 201.

Figure 3B:
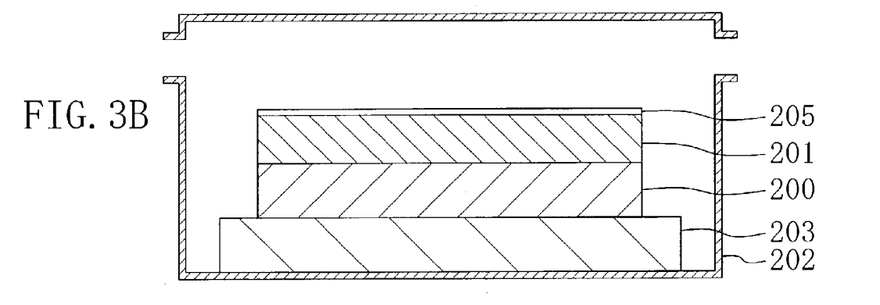

Next, as shown in FIG. 3B, the supply of the hexamethyldisilazane 204 to the chamber 202 is stopped and the substrate 200 is annealed with the first hot plate 203 at a temperature of 120° C. for 120 seconds. Thus, the orientation of the first molecular layer 205 is disordered as shown in FIG. 7.

Figure 3C:
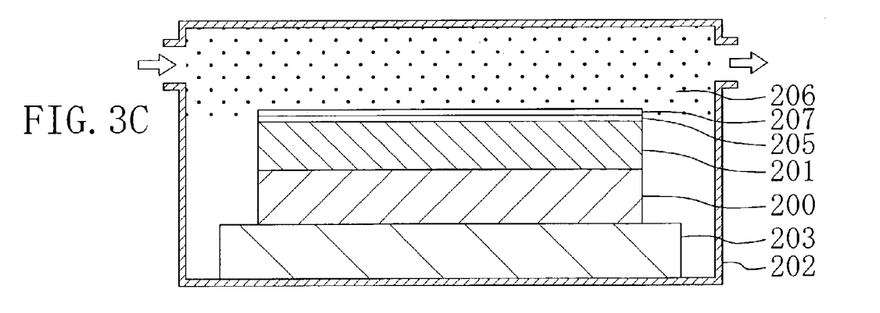

Then, as shown in FIG. 3C, while annealing the substrate 200 with the first hot plate 203 at a temperature of 100° C. in the chamber 202, gas-phase hexamethyldisilazane 206 is supplied onto the surface of the first molecular layer 205 for 90 seconds, thereby forming a second molecular layer 207 of trimethylsilyl groups on the first molecular layer 205. In this manner, the second molecular layer 207 is formed as shown in FIG. 7 in such a manner that the trimethylsilyl groups of the second molecular layer 207 are caught between the trimethylsilyl groups of the first molecular layer 205 whose orientation has been disordered.

Figure 3D:
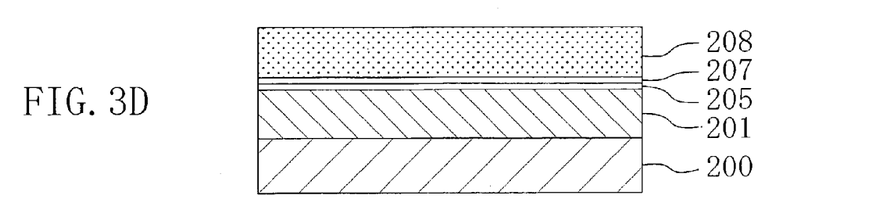

Thereafter, as shown in FIG. 3D, the substrate 200 is taken out of the chamber 202, and the chemically amplified resist material having the aforementioned composition is applied over the low dielectric insulating film 201 having the second molecular layer 207 thereon, so as to form a resist film 208 with a thickness of 0.4 µm.

Figure 4A:
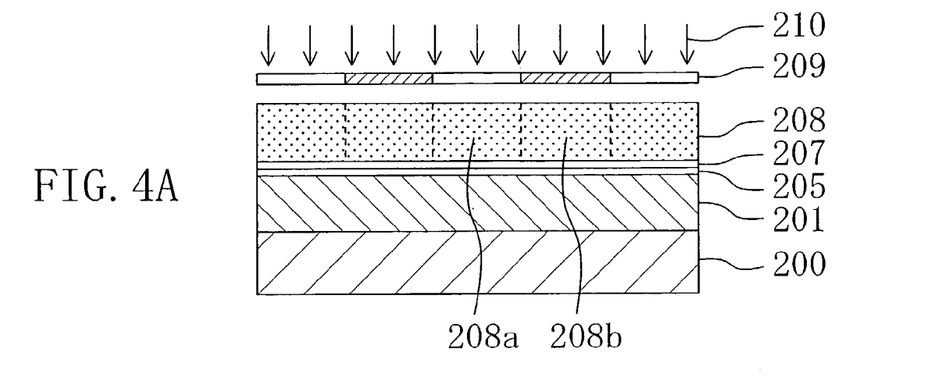
FIGS. 4A, 4B and 4C are cross-sectional views for showing other procedures in the pattern formation method of Embodiment 2.

Then, as shown in FIG. 4A, pattern exposure is carried out by irradiating the resist film 208 with ArF excimer laser 210 emitted from an ArF excimer laser exposure machine (with numerical aperture NA of 0.60) through a photomask 209 having a desired pattern.

Figure 4B:
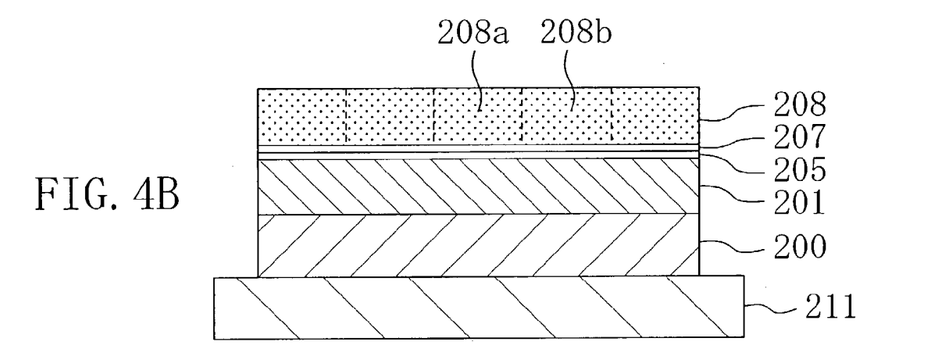

Next, as shown in FIG. 4B, the resist film 208 is subjected to post-exposure bake (PEB) by annealing the substrate 200 with a second hot plate 211 at a temperature of 105° C. for 90 seconds. Thus, an exposed portion 208a of the resist film 208 becomes soluble in an alkaline developer because an acid is generated from the acid generator therein while an unexposed portion 208b of the resist film 208 remains insoluble in an alkaline developer because no acid is generated from the acid generator therein.

Figure 4C:
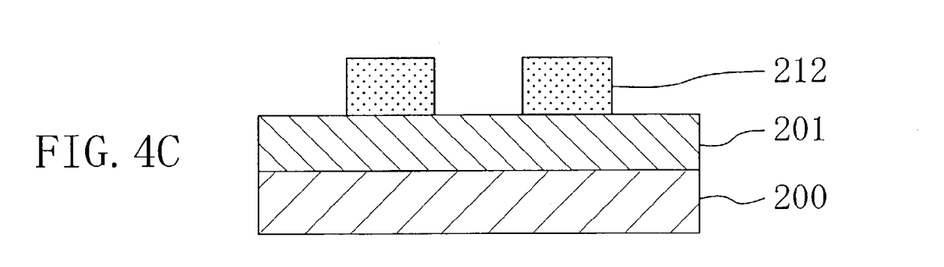

Next, after the pattern exposure, the resist film 208 is developed with an alkaline developer of a 2.38 wt % tetramethylammonium hydroxide aqueous solution for 60 seconds and then is rinsed with pure water for 60 seconds. Then, the resultant resist film 208 is dried. Thus, a resist pattern 212 with a pattern width of 0.11 µm formed from the unexposed portion 208b of the resist film 208 is obtained in a rectangular cross-sectional shape free from a footing shape as shown in FIG. 4C.

In Embodiment 2, the resist film 208 is formed above the low dielectric insulating film 201 having the two molecular layers of the first molecular layer 205 and the second molecular layer 207 thereon, and therefore, moisture or an alkaline impurity included in the low dielectric insulating film 201 is blocked by the two molecular layers and hence minimally reaches the bottom of the resist film 208. Therefore, when the resist film 208 is subjected to the pattern exposure, the phenomenon that the acid generated from the acid generator is degraded in the acidity by the moisture or is deactivated through neutralization with the alkaline impurity minimally occurs. As a result, a catalytic reaction of the acid can be sufficiently carried out at the bottom of the exposed portion 208a of the resist film 208, so that the resist pattern 212 can be formed in a good cross-sectional shape free from a footing shape.

In Embodiment 2, when the low dielectric insulating film 201 is allowed to stand in the chamber 202 with the supply of the hexamethyldisilazane 204 stopped, the substrate 200 is annealed with the first hot plate 203 at a temperature of 120° C., but the substrate 200 may be annealed with thermal inertia of the first hot plate 203 instead.

Also, although the hexamethyldisilazane 206 is supplied while annealing the substrate 200 in forming the second molecular layer 209 on the first molecular layer 205 in Embodiment 2, the hexamethyldisilazane 206 may be supplied without annealing the substrate 200.

Embodiment 3

A pattern formation method according to Embodiment 3 of the invention will now be described with reference to FIGS. 5A through 5D and 6A through 6C.

First, a chemically amplified resist material having the following composition is prepared:

| Base polymer: poly(vinyl phenol) | 6 g |
|---|---|
| Crosslinking agent: 2,4,6-tris(methoxymethyl) amino-1,3,5-s-triazine | 0.12 g |
| Acid generator: phthalimino triflate | 0.02 g |
| Solvent: propylene glycol monomethyl ether acetate | 30 g |

Figure 5A:
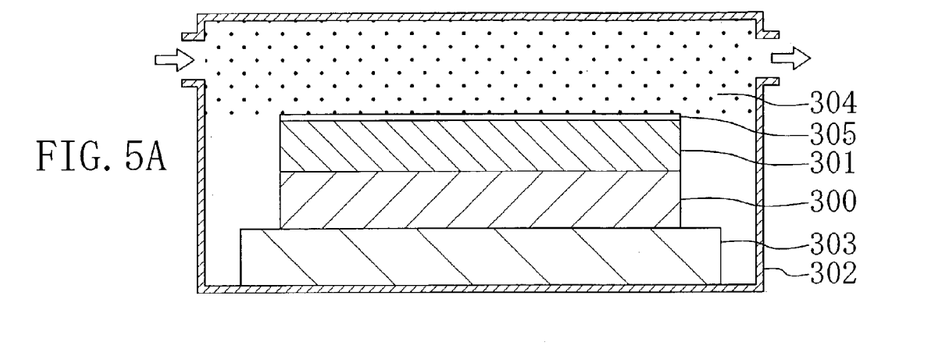
FIGS. 5A, 5B, 5C and 5D are cross-sectional views for showing procedures in a pattern formation method according to Embodiment 3 of the invention.

Next, as shown in FIG. 5A, an organic polymer made of aromatic hydrocarbon including no fluorine (for example, SiLK manufactured by Hitachi Chemical Co., Ltd. (with a dielectric constant of 2.65)) is deposited on a substrate 300, so as to form a low dielectric insulating film 301 corresponding to an underlying film. Thereafter, the substrate 300 is placed in a first chamber 302 and kept on a first hot plate 303. Then, while annealing the substrate 300 with the first hot plate 303 at a temperature of 90° C., gas-phase hexamethyldisilazane 304 is supplied onto the surface of the low dielectric insulating film 301 for 90 seconds, thereby forming a first molecular layer 305 of trimethylsilyl groups on the low dielectric insulating film 301.

Figure 5B:
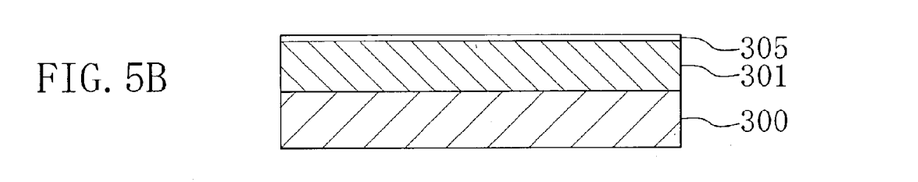

Next, as shown in FIG. 5B, the substrate 300 is taken out of the first chamber 302, and the low dielectric insulating film 301 is allowed to stand outside the first chamber 302. Thus, the orientation of the first molecular layer 305 is disordered as shown in FIG. 7.

Figure 5C:
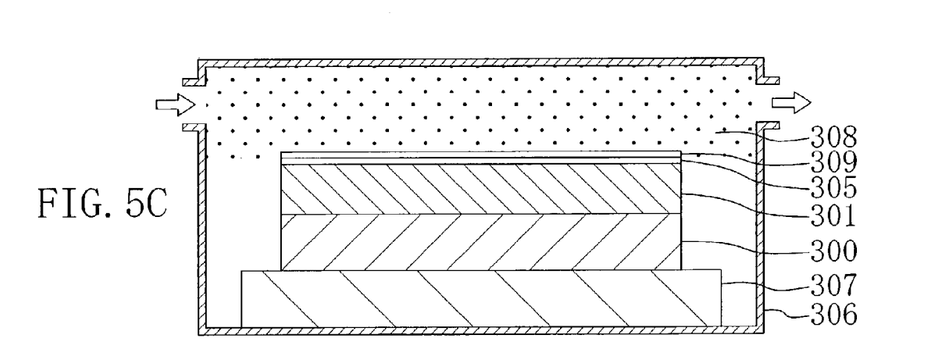

Then, as shown in FIG. 5C, the substrate 300 is placed in a second chamber 306 and gas-phase hexamethyldisilazane 308 is supplied onto the surface of the first molecular layer 305 for 120 seconds, thereby forming a second molecular layer 309 of trimethylsilyl groups on the first molecular layer 305. In this manner, the second molecular layer 309 is formed as shown in FIG. 7 in such a manner that the trimethylsilyl groups of the second molecular layer 309 are caught between the trimethylsilyl groups of the first molecular layer 305 whose orientation has been disordered.

Figure 5D:
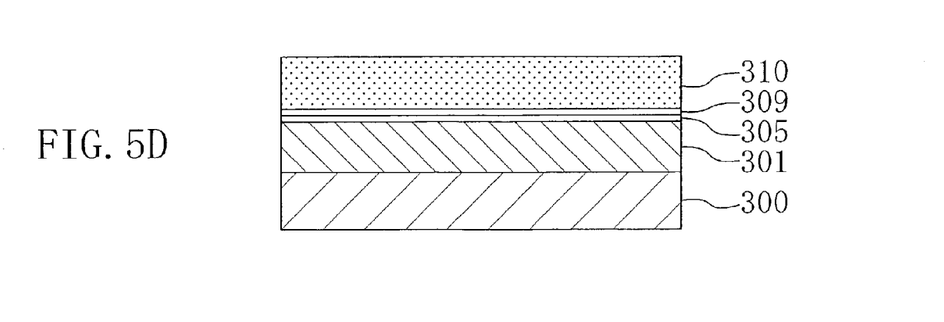

Thereafter, as shown in FIG. 5D, the substrate 300 is taken out of the second chamber 306, and the chemically amplified resist material having the aforementioned composition is applied over the low dielectric insulating film 301 having the second molecular layer 309 thereon, so as to form a resist film 310 with a thickness of 0.4 μm.

Figure 6A:
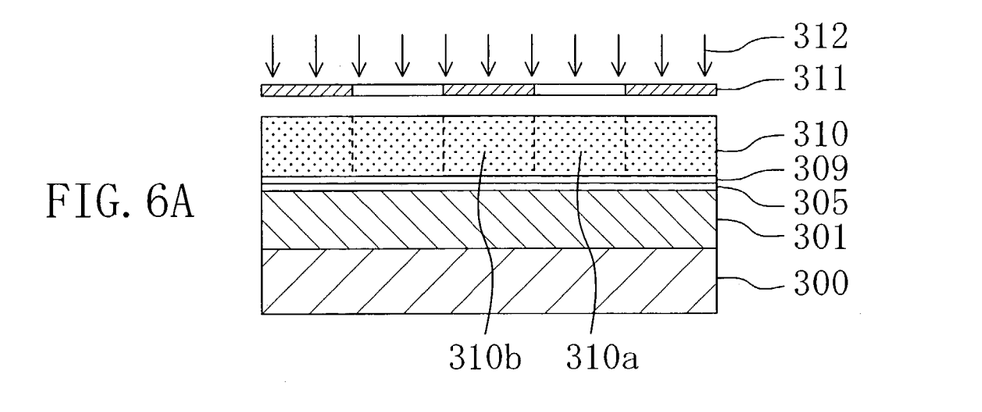
FIGS. 6A, 6B and 6C are cross-sectional views for showing other procedures in the pattern formation method of Embodiment 3.

Then, as shown in FIG. 6A, pattern exposure is carried out by irradiating the resist film 310 with KrF excimer laser 312 emitted from a KrF excimer laser exposure machine (with numerical aperture NA of 0.68) through a photomask 311 having a desired pattern.

Figure 6B:
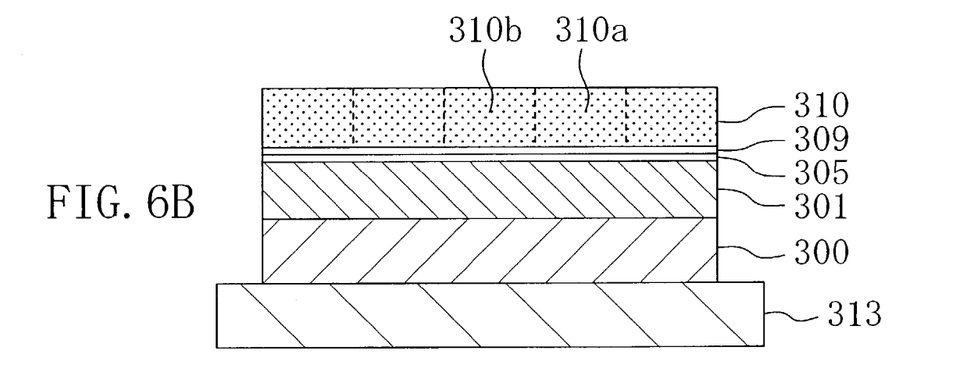

Next, as shown in FIG. 6B, the resist film 310 is subjected to post-exposure bake (PEB) by annealing the substrate 300 with a second hot plate 313 at a temperature of 120° C. for 90 seconds. Thus, an exposed portion 310a of the resist film 310 becomes insoluble in an alkaline developer due to the function of the crosslinking agent because an acid is generated from the acid generator therein while an unexposed portion 310b of the resist film 310 remains soluble in an alkaline developer because no acid is generated from the acid generator therein.

Figure 6C:
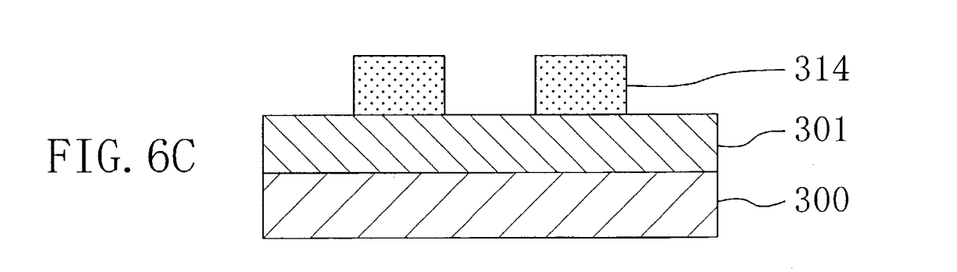

Next, after the pattern exposure, the resist film 310 is developed with an alkaline developer of a 2.38 wt % tetramethylammonium hydroxide aqueous solution for 60 seconds and then is rinsed with pure water for 60 seconds. Then, the resultant resist film 310 is dried. Thus, a resist pattern 314 with a pattern width of 0.13 μm formed from the exposed portion 310a of the resist film 310 is obtained in a rectangular cross-sectional shape free from an undercut shape as shown in FIG. 6C.

In Embodiment 3, the resist film 310 is formed above the low dielectric insulating film 301 having the two molecular layers of the first molecular layer 305 and the second molecular layer 309 thereon, and therefore, moisture or an alkaline impurity included in the low dielectric insulating film 301 is blocked by the two molecular layers and hence minimally reaches the bottom of the resist film 310. Therefore, when the resist film 310 is subjected to the pattern exposure, the phenomenon that the acid generated from the acid generator is degraded in the acidity by the moisture or is deactivated through neutralization with the alkaline impurity minimally occurs. As a result, a catalytic reaction of the acid can be sufficiently carried out at the bottom of the exposed portion 310a of the resist film 310, so that the resist pattern 314 can be formed in a good cross-sectional shape free from an undercut shape.

In Embodiment 3, when the low dielectric insulating film 301 is allowed to stand outside the first chamber 302, the substrate 300 may or may not be annealed.

Also, although the hexamethyldisilazane 308 is supplied without annealing the substrate 300 in forming the second molecular layer 309 on the first molecular layer 305 in Embodiment 3, the hexamethyldisilazane 308 may be supplied while annealing the substrate 300.

Furthermore, in Embodiment 3, the first chamber 302 and the second chamber 306 may be the same chamber or different chambers.

Although the pattern formation method of Embodiment 3 corresponds to that of Embodiment 1, it may be performed in one chamber as in Embodiment 2 by forming the first molecular layer 305 on the low dielectric insulating film 301, stopping the supply of the hexamethyldisilazane and then forming the second molecular layer 309 on the first molecular layer.

What is claimed is:

1. A pattern formation method comprising the steps of:
   forming, on a substrate, an underlying film having pores or including an organic material;
   forming a first molecular layer of trimethylsilyl groups on said underlying film by supplying hexamethyldisilazane onto a surface of said underlying film while annealing said substrate in a first chamber;
   allowing said underlying film having said first molecular layer thereon to stand outside the first chamber;
   forming a second molecular layer of trimethylsilyl groups on said first molecular layer by supplying hexamethyldisilazane onto a surface of said first molecular layer in a second chamber;

forming a resist film made of a chemically amplified resist material above said underlying film having said second molecular layer thereon;

performing pattern exposure by selectively irradiating said resist film with exposing light; and forming a resist pattern by developing said resist film after the pattern exposure.

2. The pattern formation method of claim 1, wherein the step of allowing said underlying film to stand outside the first chamber includes a sub-step of annealing said substrate.

3. The pattern formation method of claim 1, wherein the step of forming a second molecular layer includes a sub-step of annealing said substrate.

4. The pattern formation method of claim 1, wherein the resist pattern has a pattern width of 0.11 $\mu$m.

5. The pattern formation method of claim 1, wherein the organic material has an aromatic hydrocarbon including no fluorine.

* * * * *